US011355447B2

(12) United States Patent
Yang et al.

(10) Patent No.: US 11,355,447 B2
(45) Date of Patent: Jun. 7, 2022

(54) ELECTRONIC PANEL AND METHOD OF MANUFACTURING THE SAME

(71) Applicant: Samsung Display Co., Ltd., Yongin-si (KR)

(72) Inventors: Sung-Jin Yang, Cheonan-si (KR); Taeik Kim, Asan-si (KR); Hyunsik Park, Cheonan-si (KR); Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 147 days.

(21) Appl. No.: 16/812,192

(22) Filed: Mar. 6, 2020

(65) Prior Publication Data

US 2020/0319729 A1 Oct. 8, 2020

(30) Foreign Application Priority Data

Apr. 8, 2019 (KR) .......................... 10-2019-0040903

(51) Int. Cl.
*H01L 23/544* (2006.01)
*G06F 3/041* (2006.01)
(Continued)

(52) U.S. Cl.
CPC ............ *H01L 23/544* (2013.01); *G06F 3/041* (2013.01); *G06F 3/0443* (2019.05);
(Continued)

(58) Field of Classification Search
CPC ................ H01L 23/544; H04M 1/0266; G06F 3/04164; G06F 3/0443; G06F 3/041;
(Continued)

(56) References Cited

U.S. PATENT DOCUMENTS

2005/0161836 A1\* 7/2005 Yudasaka .......... H01L 29/66757
257/797
2008/0277259 A1\* 11/2008 Chang ................... G06F 3/0446
200/600

(Continued)

FOREIGN PATENT DOCUMENTS

KR 10-1082293 B1 11/2011
KR 10-2018-0070218 A 6/2018
KR 10-2018-0110924 A 10/2018

*Primary Examiner* — Julie Anne Watko
(74) *Attorney, Agent, or Firm* — Lewis Roca Rothgerber Christie LLP

(57) ABSTRACT

An electronic device includes a first sensing insulation layer having a first opening defined thereon, a first sensing electrode including a first sensing pattern and a first connection pattern connected to each other, a second sensing electrode including a second sensing pattern spaced apart from the first sensing pattern and a second connection pattern connected to the second sensing pattern and on a different layer from the first connection pattern with the first sensing insulation layer interposed therebetween, sensing lines connected to the first sensing electrode and the second sensing electrode, respectively, a pad unit including sensing pads connected to a corresponding sensing line selected from among the sensing lines, and an input sensing unit including an align key, wherein the align key is exposed through the first sensing insulation layer by the first opening.

20 Claims, 12 Drawing Sheets

(51) Int. Cl.
*G06F 3/044* (2006.01)
*H04M 1/02* (2006.01)

(52) U.S. Cl.
CPC ........ G06F 3/04164 (2019.05); *G06F 3/0412* (2013.01); *G06F 3/0446* (2019.05); *G06F 2203/04103* (2013.01); *G06F 2203/04111* (2013.01); *H04M 1/0266* (2013.01)

(58) Field of Classification Search
CPC ................ G06F 3/0446; G06F 3/0412; G06F 2203/04103; G06F 2203/04111
See application file for complete search history.

(56) References Cited

U.S. PATENT DOCUMENTS

| | | | |
|---|---|---|---|
| 2009/0246891 A1* | 10/2009 | Sato | G03F 9/7084 438/14 |
| 2011/0057893 A1 | 3/2011 | Kim et al. | |
| 2015/0076665 A1* | 3/2015 | Shiu | H01L 23/544 257/620 |
| 2018/0006096 A1* | 1/2018 | Choi | B32B 27/08 |
| 2018/0175116 A1 | 6/2018 | Song et al. | |
| 2018/0287092 A1 | 10/2018 | Song et al. | |
| 2019/0088909 A1* | 3/2019 | Cheon | H01L 51/5253 |
| 2019/0324315 A1* | 10/2019 | Ohashi | G02F 1/133611 |
| 2020/0219820 A1* | 7/2020 | Chen | H01L 33/52 |

\* cited by examiner

ELECTRONIC PANEL AND METHOD OF MANUFACTURING THE SAME

CROSS-REFERENCE TO RELATED APPLICATION

This application claims priority to and the benefit of Korean Patent Application No. 10-2019-0040903, filed on Apr. 8, 2019, the entire contents of which are hereby incorporated by reference.

BACKGROUND

1. Field

Embodiments of the present disclosure herein relate to an electronic panel, and, for example, to an electronic panel with improved reliability.

2. Description of the Related Art

An electronic device is activated by being applied to an electrical signal. The electronic device may include an electronic panel for sensing various types or kinds of input applied from the outside. The electronic panel may be used alone, or may further include a display unit configured to display an image, and the like, thereby improving user convenience.

The electronic device may include various electrode patterns to be activated by an electrical signal. A region in which the electrode patterns are activated either displays information or reacts to a touch applied from the outside.

SUMMARY

Embodiments of the present disclosure provide an electronic panel including a structure with improved alignment properties.

An embodiment of the present disclosure provides an electronic device including an input sensing unit including an active region and a non-active region adjacent to the active region, wherein the input sensing unit includes a first sensing insulation layer having a first opening overlapping the non-active region, a first sensing electrode in the active region, the first sensing electrode including a first sensing pattern and a first connection pattern connected to each other, a second sensing electrode in the active region, the second sensing electrode including a second sensing pattern and a second connection pattern, wherein the second sensing pattern is spaced apart from the first sensing pattern, wherein the second connection pattern is connected to the second sensing pattern and is on a different layer from the first connection pattern, and wherein the first sensing insulation layer is between the second sensing pattern and the first connection pattern, sensing lines in the non-active region are connected to the first sensing electrode and the second sensing electrode, respectively, a pad unit in the non-active region, the pad unit including sensing pads connected to a corresponding sensing line selected from among the sensing lines, and an align key in the non-active region, wherein the align key is exposed through the first sensing insulation layer by the first opening.

In an embodiment, the electronic devices may include a second sensing insulation layer on the first sensing insulation layer, the second sensing insulation layer having a second opening aligned with the first opening, wherein the align key is exposed through the second sensing insulation layer by the second opening.

In an embodiment, a thickness of each of the first sensing insulation layer and the second sensing insulation layer may be in a range from about 2000 Å to about 2500 Å.

In an embodiment, the align key may be on a lower portion of the first sensing insulation layer and the align key includes a transparent conductive material.

In an embodiment, the first connection pattern and each of the sensing pads of the pad unit may be on the same layer as the align key and include the same material as that of the align key.

In an embodiment, a thickness of each of the align key, the first connection pattern, and the sensing pads of the pad unit in a third direction may be about 400 Å.

In an embodiment, the first sensing electrode may include one end relatively adjacent to the pad unit and an other end facing away from the one end in a direction away from the pad unit, and at least one of the sensing lines connected to the first sensing electrode selected from among the sensing lines may include a first line connected to the one end, a second line connected to the other end, and a bridge pattern connected to the first line and the second line.

In an embodiment, the bridge pattern may be on a lower portion of the first sensing insulation layer, and each of the first line and the second line may be on the first sensing insulation layer and connected to the bridge pattern through contact holes defined in the first sensing insulation layer.

In an embodiment, the first line may be connected to a corresponding sensing pad selected from among the sensing pads through a contact hole defined in the first sensing insulation layer.

In an embodiment, the sensing pads may be on the same layer as that of the bridge pattern and the align key, and the sensing pads include the same transparent conductive material.

In an embodiment, each of the sensing lines may include a first sub-line and a second sub-line spaced apart from each other with the first sensing insulation layer interposed therebetween, wherein the first sub-line and the second sub-line may overlap each other, and be connected through a contact hole defined in the first sensing insulation layer.

In an embodiment, the input sensing unit may include connection pads overlapping a corresponding sensing pad selected from among the sensing pads, and the input sensing unit further includes a sensing circuit board connected to the pad unit.

In an embodiment of the present disclosure, an electronic device includes a display unit including pixels configured to display an image, and an input sensing unit on the display unit, the input sensing unit including an active region and a non-active region adjacent to the active region, wherein the input sensing unit includes a first sensing insulation layer in the active region and the non-active region, a first sensing electrode in the active region, the first sensing electrode including a first sensing pattern on the first sensing insulation layer, and a first connection pattern on a lower portion of the first sensing insulation layer and connected to the first sensing pattern through the first sensing insulation layer, a second sensing electrode in the active region, the second sensing electrode including a second sensing pattern on the first sensing insulation layer and spaced apart from the first sensing pattern, and a second connection pattern connected to the second sensing pattern, a second sensing insulation layer on the first sensing insulation layer, sensing lines in the non-active region and connected to the first sensing electrode and the second sensing electrode, respectively, a pad unit in the non-active region, the pad unit including sensing pads connected to a corresponding sensing line selected from among the sensing lines, and an align key in the non-active region, wherein the align key is exposed through the first sensing insulation layer and the second sensing insulation layer, respectively.

In an embodiment, the align key may be on a lower portion of the first sensing insulation layer and the align key includes a transparent conductive material.

In an embodiment, the first connection pattern and each of the sensing patterns of the pad unit may be on the same layer as the align key and include the same material as that of the align key.

In an embodiment, each of the first sensing pattern, the second sensing pattern, the second connection pattern, and the sensing lines may be on the first sensing insulation layer and include a metal.

In an embodiment, the first sensing electrode may include one end relatively adjacent to the pad unit and an other end facing away from the one end in a direction away from the pad unit, and at least one of sensing lines connected to the first sensing electrode selected from among the sensing lines may include a first line connected to the one end, a second line connected to the other end, and a bridge pattern connected to the first line and the second line.

In an embodiment of the present disclosure, an electronic device includes a display unit including light emitting patterns configured to display an image, and an input sensing unit on the display unit, the input sensing unit including an active region overlapping the light emitting patterns and a non-active region adjacent to the active region, and the input sensing unit including an align region and a pad region, wherein the input sensing unit includes a first conductive layer on the display unit, the first conductive layer including a plurality of first conductive patterns containing a transparent conductive material, a second conductive layer on the first conductive layer, the second conductive layer including a plurality of second conductive patterns containing a metal, a first sensing insulation layer between the first conductive layer and the second conductive layer, the first insulation layer having a first opening, and a sensing circuit board connected to the pad region, wherein at least a portion of a first conductive pattern on the align region selected from among the first conductive patterns is exposed through the first sensing insulation layer by the first opening.

In an embodiment, the first conductive pattern exposed by the first opening may be provided as an align key.

In an embodiment, the electronic devices may include a second sensing insulation layer on the first sensing insulation layer, the second sensing insulation layer having a second opening aligned with the first opening, wherein the align key is exposed through the second sensing insulation layer by the second opening.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of embodiments of the present disclosure. In the drawings.

DETAILED DESCRIPTION

Figure 1A:
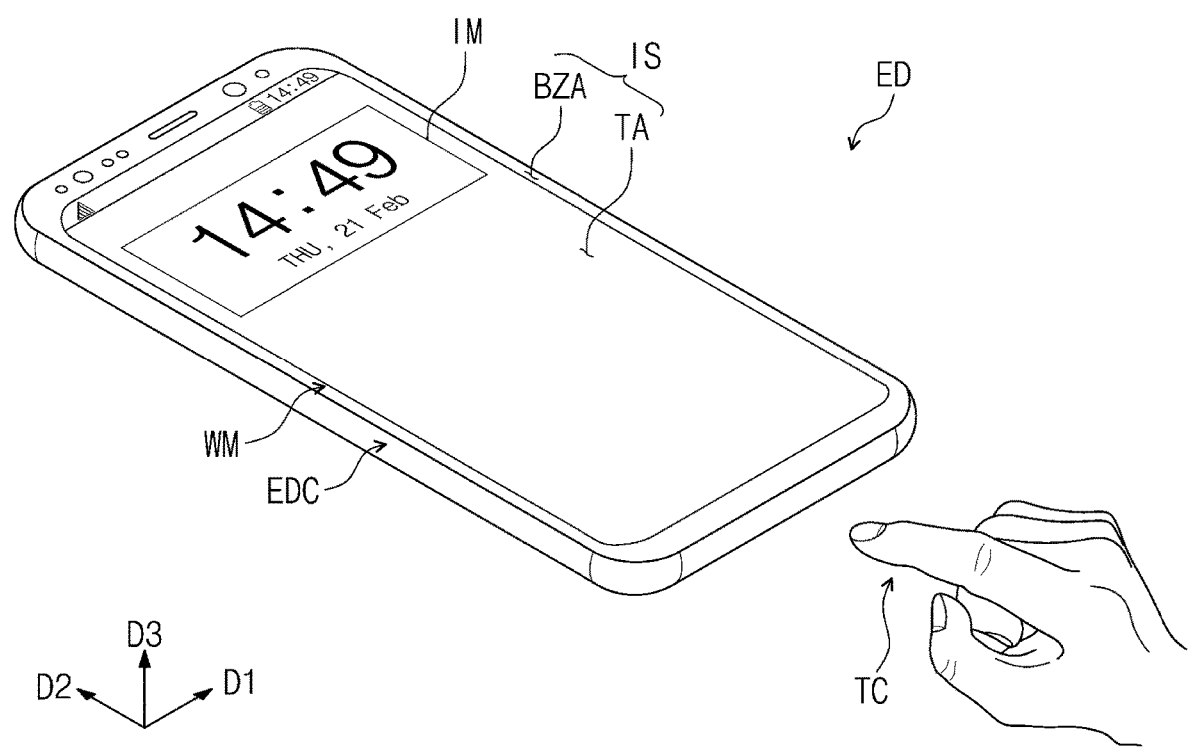
FIG. 1A is a coupling perspective view of an electronic device according to an embodiment of the present disclosure.

In the present disclosure, when an element (or a region, a layer, a portion, etc.) is referred to as being "on," "connected to," or "coupled to" another element, it means that the element may be directly on/connected to/coupled to the other element, or that a third element may be therebetween.

Like reference numerals refer to like elements. Also, in the drawings, the thickness, the ratio, and the dimensions of elements may be exaggerated for an effective description of technical contents.

The term "and/or," includes all combinations of one or more of which associated configurations may define. Expressions such as "at least one of," when preceding a list of elements, modify the entire list of elements and do not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof. Hereinafter, exemplary embodiments of the present disclosure will be described with reference to the accompanying drawings.

Figure 1B:
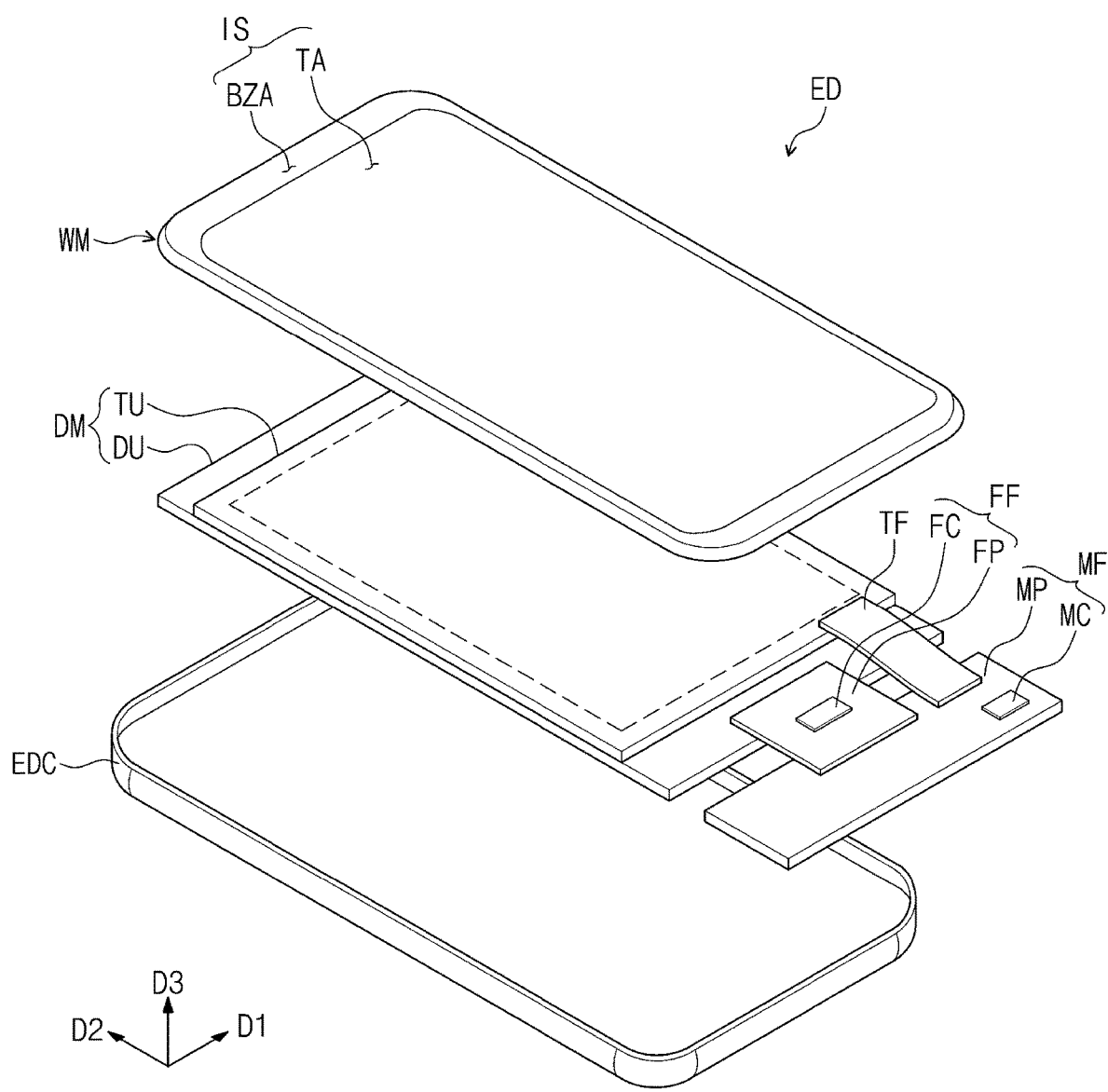
FIG. 1B is a disassembled perspective view of an electronic device according to an embodiment of the present disclosure.
Figure 2:
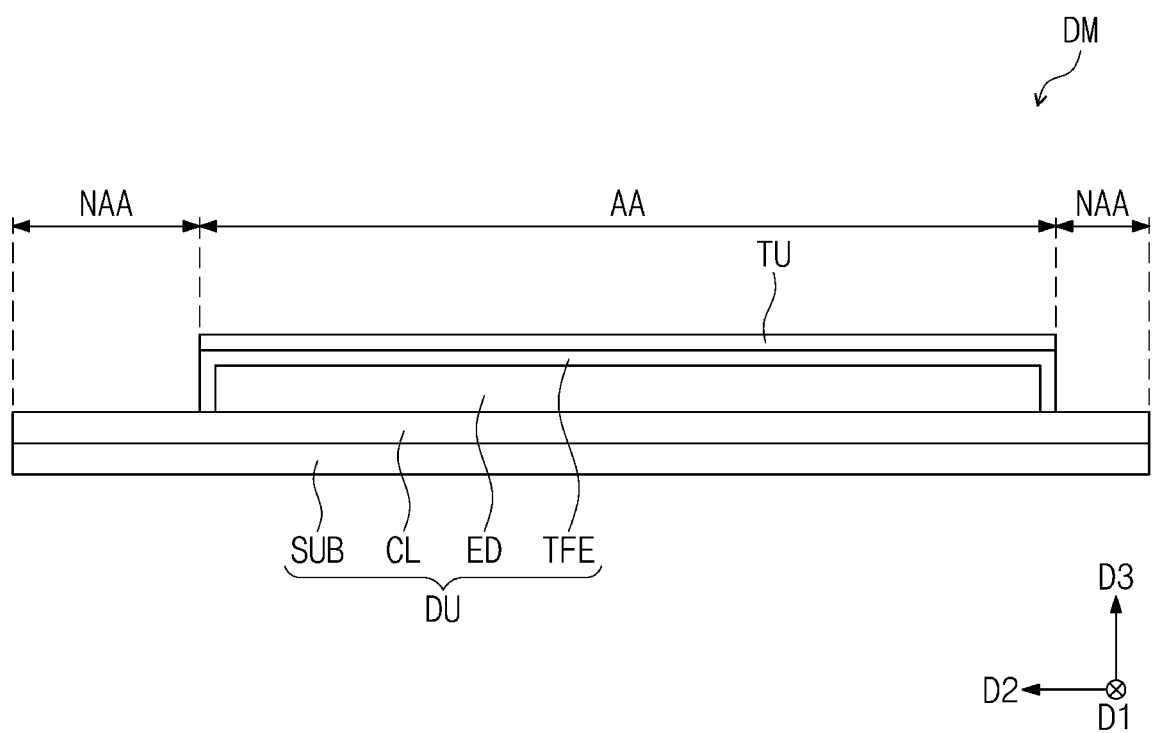
FIG. 2 is a cross-sectional view schematically showing a display module according to an embodiment of the present disclosure.
Figure 3A:
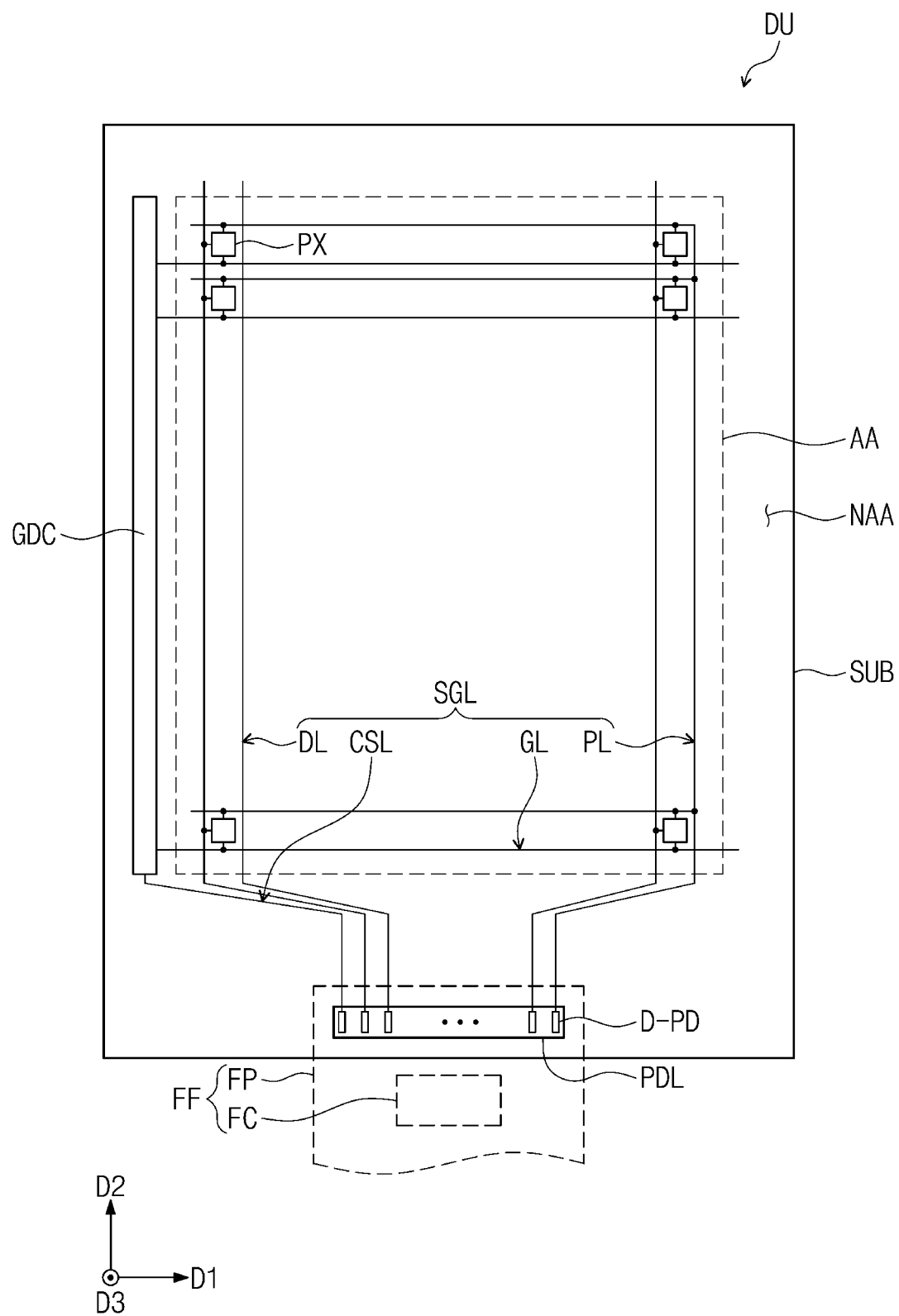
FIG. 3A is a plan view of a display panel according to an embodiment of the present disclosure.
Figure 3B:
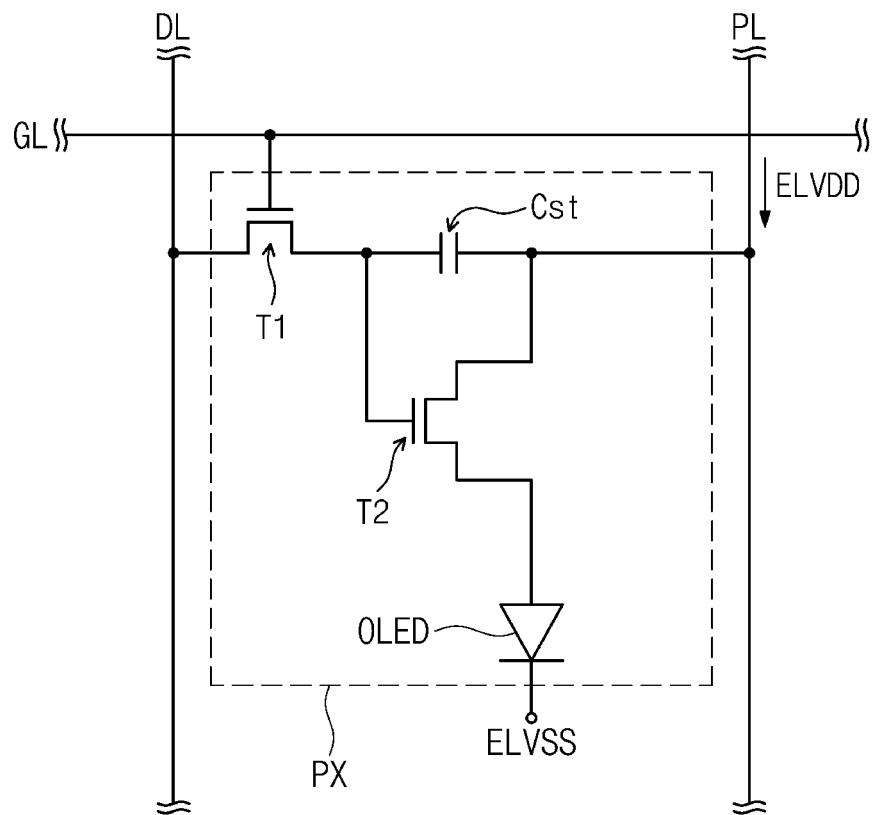
FIG. 3B is an equivalent circuit diagram of a pixel according to an embodiment of the present disclosure.

FIG. 1A is a coupling perspective view of an electronic device according to an embodiment of the present disclosure. FIG. 1B is a disassembled perspective view of an electronic device according to an embodiment of the present disclosure. FIG. 2 is a cross-sectional view schematically showing a display module according to an embodiment of the present disclosure. FIG. 3A is a plane view (e.g., plan view) of a display panel according to an embodiment of the present disclosure. FIG. 3B is an equivalent circuit diagram of a pixel according to an embodiment of the present disclosure.

Referring to FIG. 1A and FIG. 1B, an electronic device ED may be a device activated by an electrical signal. The electronic device ED may include various suitable embodiments. For example, examples of the electronic device ED may include a tablet computer, a notebook computer, a computer, a smart television and the like. In the present embodiment, the electronic device ED is exemplarily illustrated as being a smart phone.

The electronic device ED may display an image IM toward a third direction D3 on a display surface IS parallel (e.g., substantially parallel) to each of a first direction D1 and a second direction D2. The display surface IS on which the image IM is displayed may correspond to a front surface of the electronic device ED. The image IM may include both a moving image and a still image. In FIG. 1A, as an example of the image IM, an Internet search window is illustrated.

In the present embodiment, a front surface (or an upper surface) and a back surface (or a lower surface) of each member are defined in the basis of a direction in which the image IM is displayed. The front surface and the back surface oppose each other (e.g., face away from each other) in the third direction D3 and the normal direction of each of the front surface and the back surface may be parallel (e.g., substantially parallel) to the third direction D3.

The separation distance of the front surface and the back surface in the third direction D3 may correspond to the thickness/height of the electronic device ED in the third direction D3. As shown in FIGS. 4 and 5A to 5D, a fourth direction D4 and fifth direction D5 may also be considered. According to embodiments of the disclosure, directions indicated by the first direction D1, the second direction D2, the third direction D3, the fourth direction D4, and the fifth direction D5 are a relative concept, and may be converted to different directions. Hereinafter, first to fifth directions are directions indicated by the first direction D1, the second direction D2, the third direction D3, the fourth direction D4, and the fifth direction D5, respectively, and are given the same reference numerals.

The front surface of the electronic device ED may be divided into a transmissive region TA and a bezel region BZA. The transmissive region TA may be a region on which the image IM is displayed. A user visually recognizes the image IM through the transmissive region TA. In the present embodiment, the transmissive region TA is illustrated as having vertices in a rounded quadrangular shape. However, this is only exemplary, and the present disclosure is not limited thereto. The transmissive region TA may have various suitable shapes, and is not limited to any one embodiment.

The bezel region BZA is adjacent to the transmissive region TA. The bezel region BZA may have a set or predetermined color. The bezel region BZA may surround the transmissive region TA. Accordingly, the shape of the transmissive region TA may be defined substantially by the bezel region BZA. However, this is only exemplary, and the present disclosure is not limited thereto. The bezel region BZA may be adjacent to only one side of the transmissive region TA, or may be omitted. The electronic device ED according to an embodiment of the present disclosure may include various suitable embodiments, and is not limited to any one embodiment.

The electronic device ED may sense an external input TC applied from the outside. The external input TC may include various suitable forms of input provided from the outside of the electronic device ED. The external input TC applied from the outside may be provided in various suitable forms. For example, the external input TC may include not only a contact by a part of a user's body, such as a hand, but also an external input applied in close proximity, or adjacent to the electronic device ED at a set or predetermined distance (for example, hovering). Also, the external input may have various suitable forms such as, for example, force, pressure, and light, but is not limited to any one embodiment. FIG. 1A shows a user's hand as an example of the external input TC.

The electronic device ED may include a window member WM, an external case EDC, a display module DM, a main circuit board MF, and flexible circuit boards FF and TF. The display module DM may include a display unit DU and an input sensing unit TU.

The window member WM is on the display module DM. The window member WM prevents or reduces external impacts and protects the display module DM by preventing or reducing the penetration of foreign materials.

The window member WM may be made of a transparent material capable of emitting an image. For example, the window member WM may include (or be formed of) glass, sapphire, plastic, and/or the like. The window member WM is illustrated as being a single layer, but is not limited thereto. The window member WM may include a plurality of layers. In some embodiments, the bezel region BZA of the electronic device ED may be substantially provided as a region in which a material including a set or predetermined color is printed in one region of the window member WM.

The external case EDC receives the display module DM. The external case EDC may be coupled to the window member WM to define the appearance of the electronic device ED. The external case EDC absorbs impacts applied from the outside and prevents or reduces penetration of foreign materials/moisture and/or the like into the display module DM thereby protecting components received in the external case EDC. In some embodiments, the external case EDC may be provided in a form in which a plurality of receiving members are coupled to each other.

Referring to FIG. 2, the display module DM according to an embodiment may include the display unit DU and the input sensing unit TU.

The display module DM displays an image according to an electrical signal, and may transmit/receive information on the external input TC. The display module DM may be defined to include an active region AA and a non-active region NAA. The active region AA is defined as a region configured to emit or display an image provided by the display module DM, and the non-active region NAA may be a region surrounding the active region AA. However, this is only exemplary. The non-active region NAA may be defined in various suitable shapes, and is not limited to any one embodiment. The active region AA of the display module DM may correspond to the transmissive region TA.

The display unit DU includes a base substrate SUB, a circuit layer CL, a display element layer ED, and an encapsulation layer TFE.

The base substrate SUB is a flexible substrate, and may include a plastic substrate, a glass substrate, a metal substrate, and/or an organic/inorganic composite material substrate. According to an embodiment of the present disclosure, the base substrate SUB may include at least one plastic film.

The circuit layer CL is on the base substrate SUB. The circuit layer CL includes signal lines, a control circuit, and a semiconductor layer.

The display element layer ED may include an organic light emitting device OLED (see FIG. 3B) and a pixel defining film. The encapsulation layer TFE encapsulates the display element layer ED. The encapsulation layer TFE according to an embodiment of the present disclosure may include at least one organic film and at least one inorganic film. The inorganic film may protect the display element layer ED from moisture/oxygen. The inorganic film may include a silicon nitride layer, a silicon oxynitride layer, a silicon oxide layer, a titanium oxide layer, an aluminum oxide layer, and/or the like, but is not particularly limited thereto.

The organic film protects the display element layer ED from foreign materials such as dust particles, and is on the display element layer ED to provide a flat surface. The organic film may include an acrylic organic film, but is not particularly limited thereto.

In some embodiments, the encapsulation layer TFE may be provided in a substrate form including glass, sapphire, and/or plastic. According to embodiments of the disclosure, a set or predetermined seal member for coupling the encapsulation layer TFE and the base substrate SUB may be further included. The electronic device ED according to an embodiment of the present disclosure may include various suitable types or kinds of encapsulation layers TFE, but is not limited to any one embodiment.

Referring to FIGS. 3A and 3B, the display unit DU may include a driving circuit GDC, a plurality of signal lines SGL, and a plurality of pixels PX (hereinafter, pixels). The display unit DU is in the non-active region NAA and may further include a pixel pad unit PDL including pixel pads D-PD connected to (e.g., coupled to) corresponding signal lines selected from among the plurality of signal lines.

The pixels PX are on the active region AA. Each of the pixels PX includes the organic light emitting device OLED and a pixel driving circuit connected thereto (e.g., coupled thereto). The driving circuit GDC, the signal lines SGL, the pixel pad unit, and the pixel driving circuit may be included in the circuit layer CL illustrated in FIG. 1B.

The driving circuit GDC may include a gate driving circuit. The gate driving circuit generates a plurality of gate signals (hereinafter, gate signals), and sequentially outputs the gate signals to a plurality of gate lines GL (hereinafter, gate lines) to be further described herein below. The gate driving circuit may further output another control signal to the pixel driving circuit.

The gate driving circuit may include a plurality of thin film transistors formed through the same process of the driving circuit of the pixels PX, for example, a Low Temperature Polycrystalline Silicon (LTPS) process or a Low Temperature Polycrystalline Oxide (LTPO) process.

The signal lines SGL include gate lines GL, data lines DL, a power line PL, and a control signal line CSL. One gate line of the gate lines GL is connected to (e.g., coupled to) a corresponding pixel PX selected from among the plurality of pixels PX, and one data line of the data lines DL is connected to (e.g., coupled to) a corresponding pixel PX selected from among the plurality of pixels PX. The power line PL is connected to (e.g., coupled to) the pixels PX. The control signal line CSL may provide control signals to the gate driving circuit. The signal lines SGL overlap the active region AA and the non-active region NAA.

In some embodiments, the pixel pad unit PDL is a portion to which the main circuit board MF is connected (e.g., coupled), and the pixel pads D-PD of the pixel pad unit PDL are connected to (e.g., coupled to) corresponding pads of the main circuit board MF. The pixel pads D-PD may be provided by exposing some wirings in the circuit layer CL from an insulation layer included in the circuit layer CL.

The pixel pads D-PD are connected to (e.g., coupled to) the signal lines SGL, and thus, are connected to (e.g., coupled to) corresponding pixels PX. In addition, the driving circuit GDC may be connected to (e.g., coupled to) any one pixel pad selected from among the pixel pads D-PD.

A pixel PX receives a gate signal from a gate line GL, and receives a data signal from a data line DL. In addition, the pixel PX receives a first power voltage ELVDD from the power line PL. The pixel PX includes a first thin film element T1, a second thin film element T2, a capacitor Cst, and the organic light emitting device OLED.

The first thin film element T1 outputs a data signal applied to the data line DL in response to a gate signal applied to the gate line GL. The capacitor Cst charges a voltage corresponding to the data signal received from the first thin film element T1.

The second thin film element T2 is connected to (e.g., coupled to) the organic light emitting device OLED. The second thin film element T2 controls a driving current flowing in the organic light emitting device OLED in accordance with the amount of charge stored in the capacitor Cst.

The organic light emitting device OLED includes a first electrode connected to (e.g., coupled to) the second thin film element T2, a second electrode configured to receive a second power voltage ELVSS, and an organic light emitting layer therebetween. The second power voltage ELVSS has a lower level than the first power voltage ELVDD.

The organic light emitting device OLED emits light during a turn-on period of the second thin film element T2. The configuration of the pixel PX may include various suitable embodiments, but is not limited to any one embodiment.

The input sensing unit TU may be directly on the display unit DU. According to an embodiment, the input sensing unit TU may be directly on the encapsulation layer TFE.

The input sensing unit TU includes sensing electrodes and sensing lines. The sensing electrodes and the sensing lines may have a single-layered structure or a multi-layered structure.

In addition, according to another embodiment, the input sensing unit TU may be coupled to the encapsulation layer TFE through an adhesive member on the encapsulation layer TFE, but is not limited to any one embodiment.

The main circuit board MF includes a base circuit board MP and a driving element MC. The base circuit board MP is connected to (e.g., coupled to) a first flexible circuit board FF, and thus, is electrically connected to (e.g., electrically coupled to) the display unit DU, and the base circuit board MP is connected to (e.g., coupled to) a second flexible circuit board TF, and thus, is electrically connected to (e.g., electrically coupled to) the input sensing unit TU. The base circuit board MP may be composed of a flexible printed circuit board FPCB.

The driving element MC may include a signal control unit (e.g., timing controller). The signal control unit receives input image signals and converts the input image signals into image data corresponding to the operation of pixels. In addition, the signal control unit receives various suitable control signals, for example, a vertical synchronization signal, a horizontal synchronization signal, a main clock signal, a data enable signal, and/or the like, and outputs corresponding signals of each of the signals.

In some embodiments, the driving element MC may further include a circuit unit for controlling the input sensing unit TU, but is not limited to any one embodiment.

The first flexible circuit board FF is connected to (e.g., coupled to) one side of the display unit DU and electrically connects (e.g., electrically couples) the display unit DU and the main circuit board MF. The first flexible circuit board FF includes a base film FP and a driving chip FC.

The base film FP is flexible and may include a plurality of circuit wirings. Accordingly, the base film FP may be provided in various suitable forms corresponding to the purpose and form of the display unit DU.

The driving chip FC may be mounted on the base film FP in the form of a chip on film (COF). The driving chip FC may include driving elements for driving pixels, for example, a data driving circuit. Although the first flexible circuit board FF according to an embodiment of the present disclosure is shown as one, embodiments of the present disclosure are not limited thereto. For example, the first flexible circuit board FF may be provided in a plurality and connected to (e.g., coupled to) the display unit DU.

The second flexible circuit board TF is connected to (e.g., coupled to) one side of the input sensing unit TU and electrically connects (e.g., electrically couples) the input sensing unit TU and the main circuit board MF. The second flexible circuit board TF is flexible and may include a plurality of circuit wirings. The second flexible circuit board TF transmits input sensing signals provided from the main circuit board MF to the input sensing unit TU.

In some embodiments, the display unit DU may be provided with pixel pads to which the main circuit board MF is connected (e.g., is coupled). In addition, the main circuit board MF may be provided with input pads corresponding to pads included in the flexible circuit boards FF and TF.

The electronic device ED according to an embodiment may further include an electronic module including various suitable functional modules for operating the electronic device ED, a power supply module for supplying power necessary for the overall operation of the electronic device ED, a bracket coupled to the display module DM and/or the external case EDC and dividing the inner space of electronic device ED, and the like.

Figure 4:
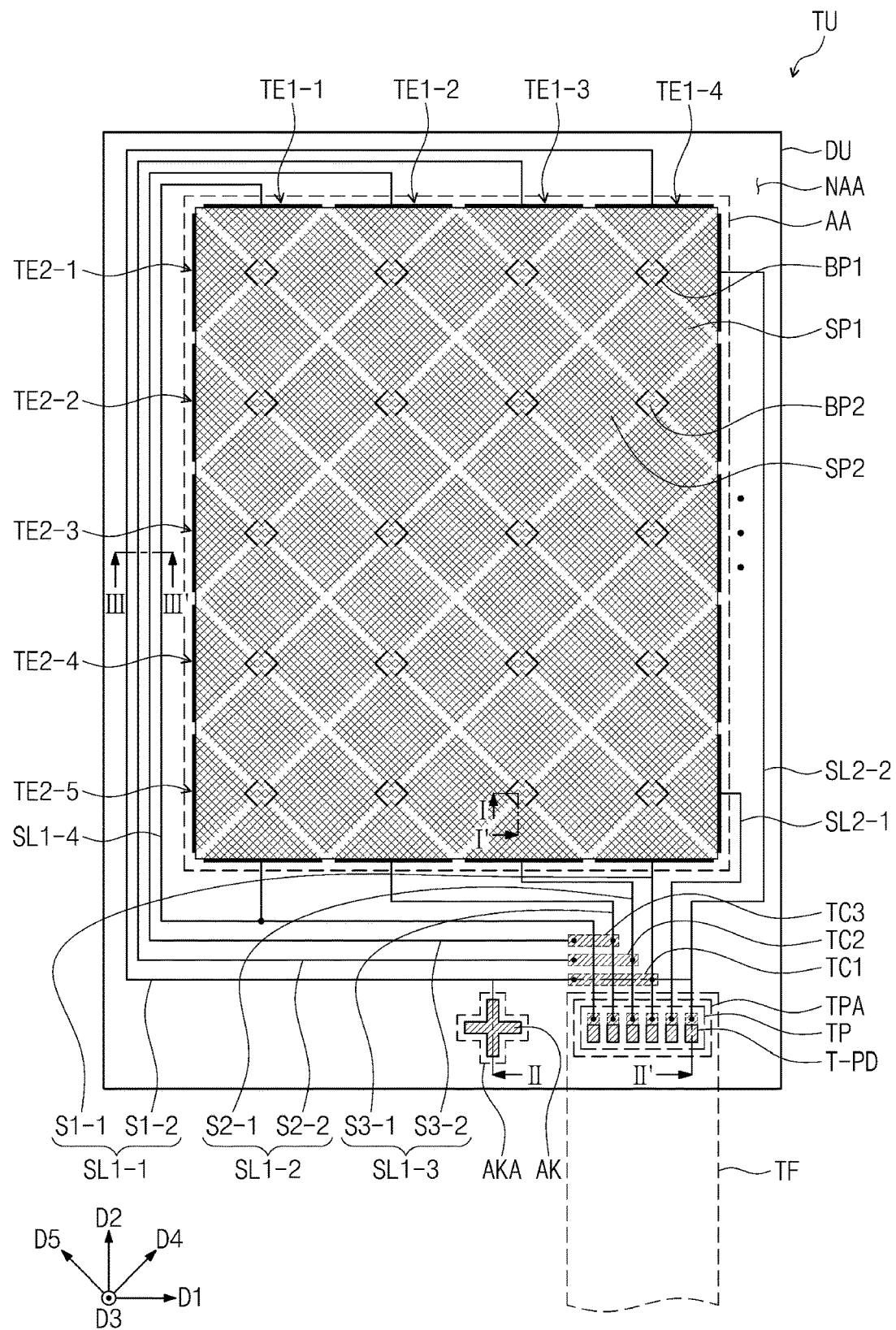
FIG. 4 is a plan view of an input sensing unit according to an embodiment of the present disclosure.
Figure 5A:
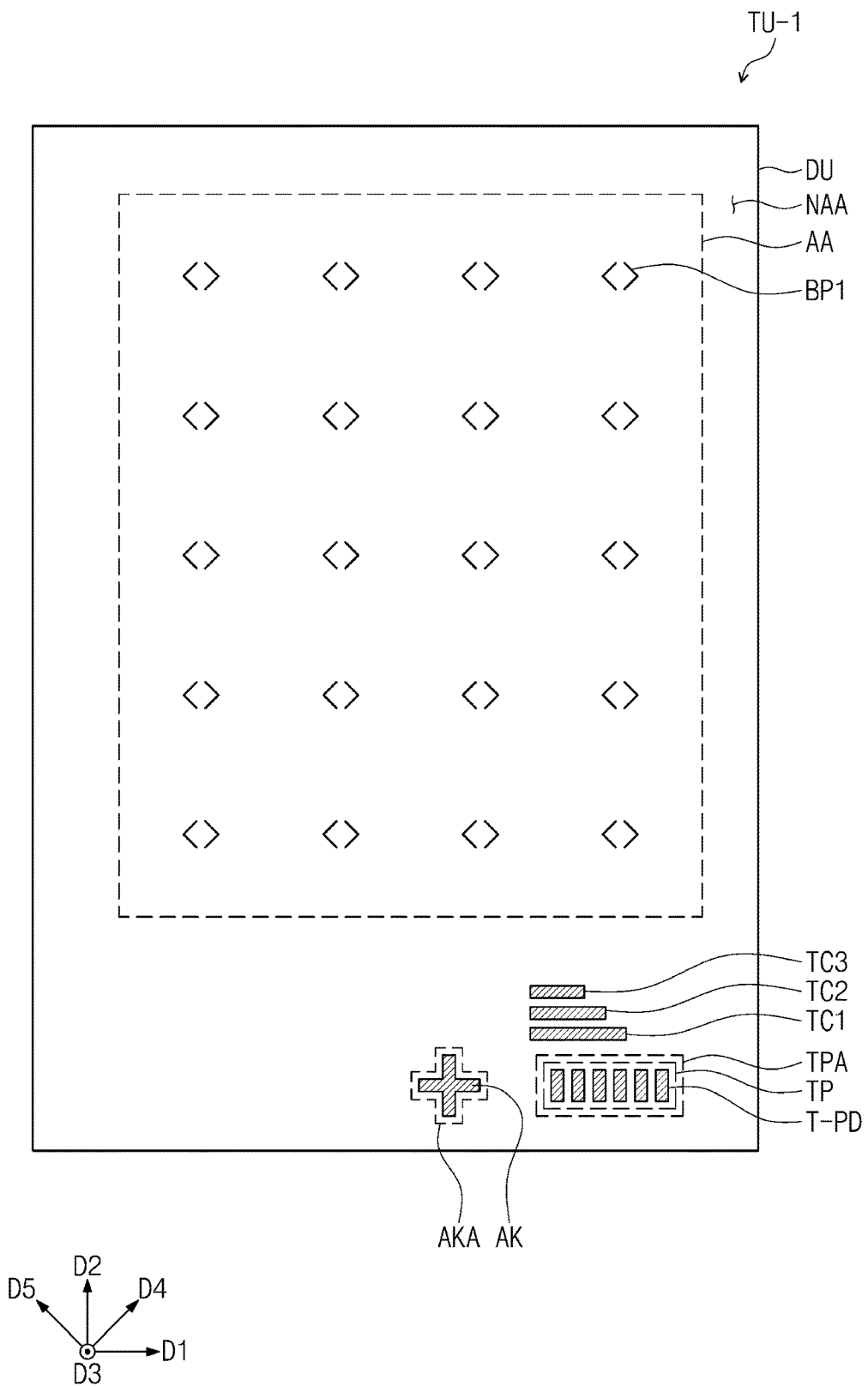
FIG. 5A to FIG. 5D are plan views showing the configuration of an input sensing unit according to an embodiment by layers.
Figure 5B:
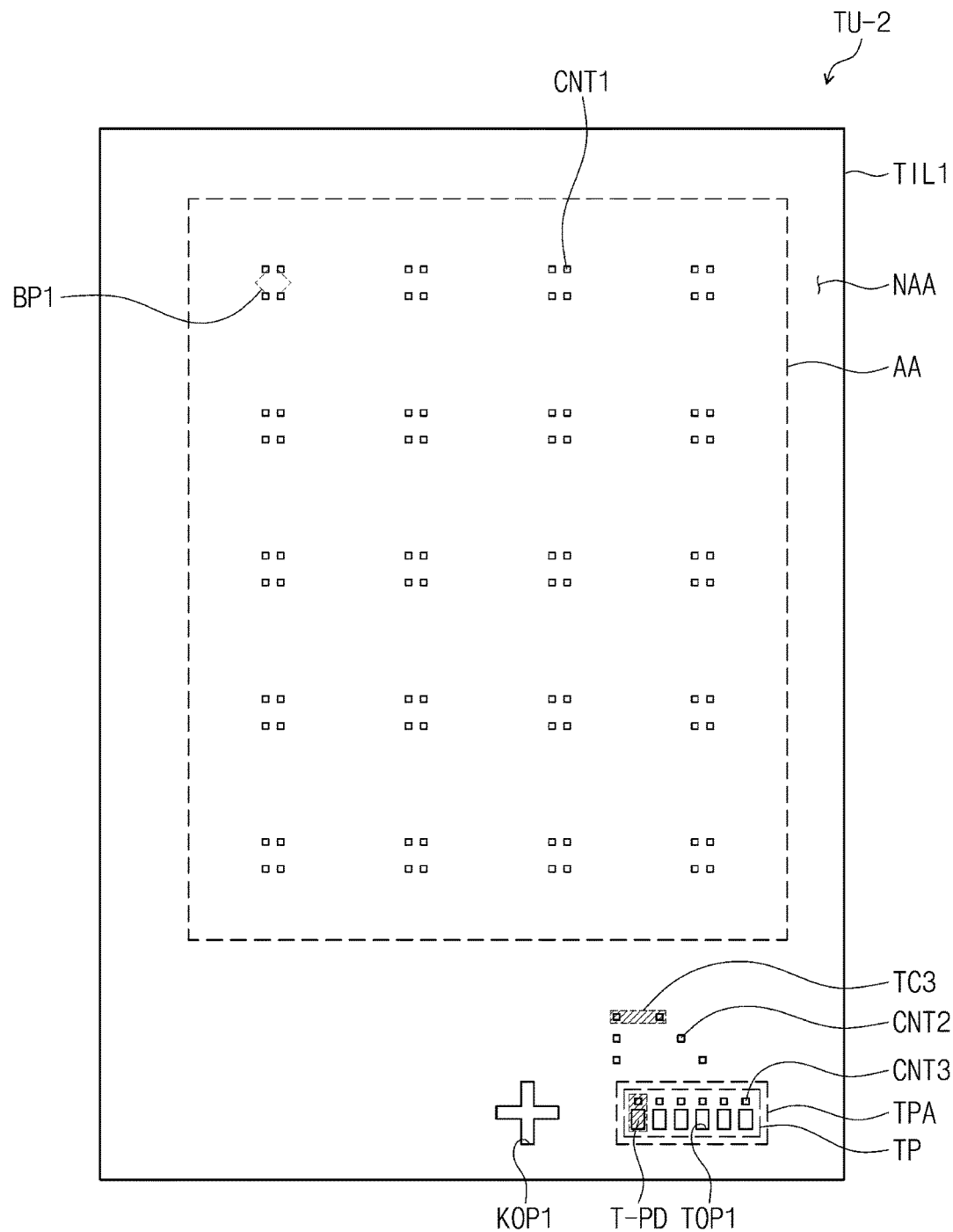
Figure 5C:
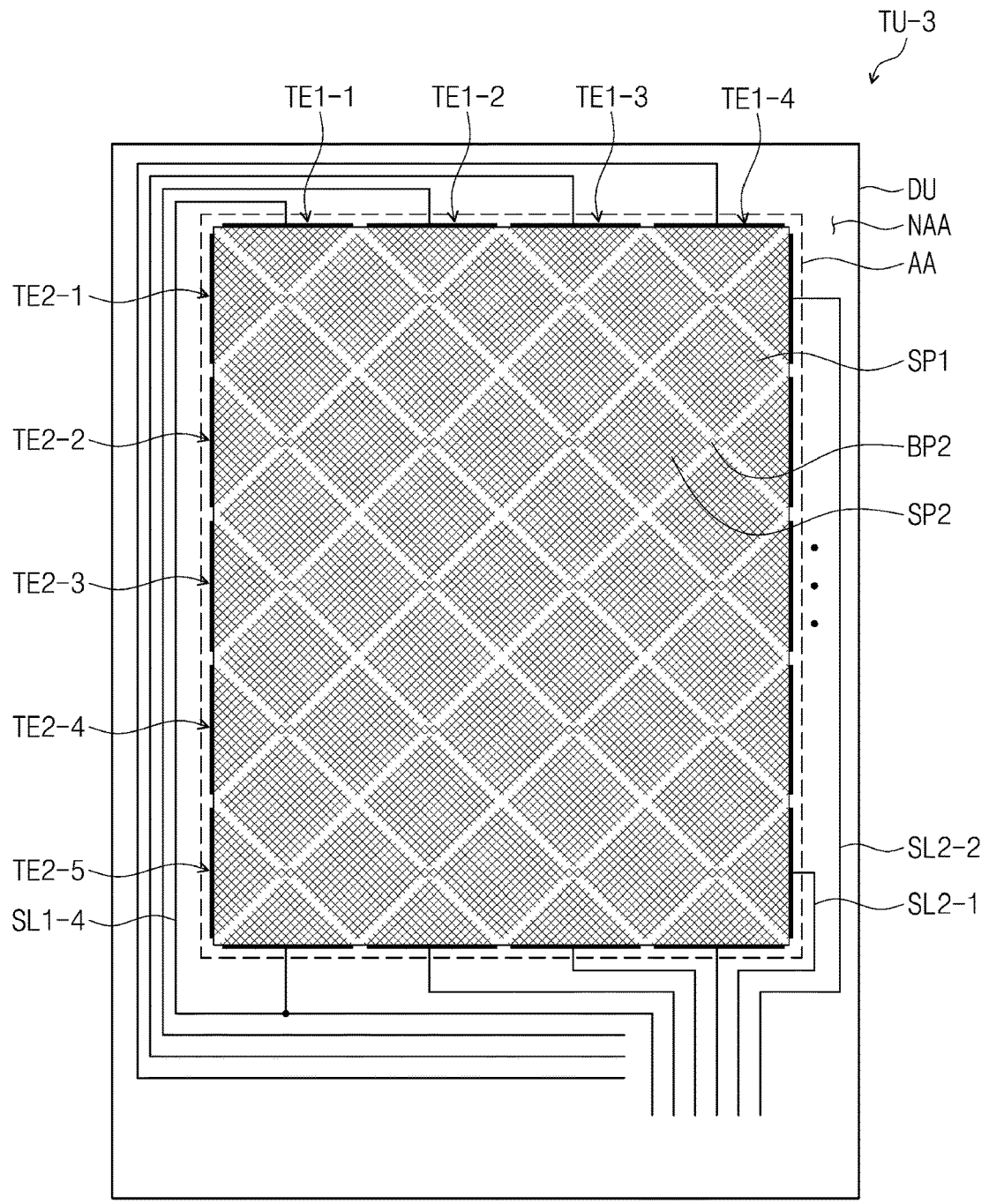

FIG. 4 is a plan view of an input sensing unit according to an embodiment of the present disclosure. FIG. 5A to FIG. 5D are plan views showing the configuration of an input sensing unit according to an embodiment by layers. FIG. 6 is cross-sectional view taken along line I-I' and II-I' shown in FIG. 4. For convenience of description, the display unit DU and the second flexible circuit board TF are illustrated with dotted lines.

Figure 5D:
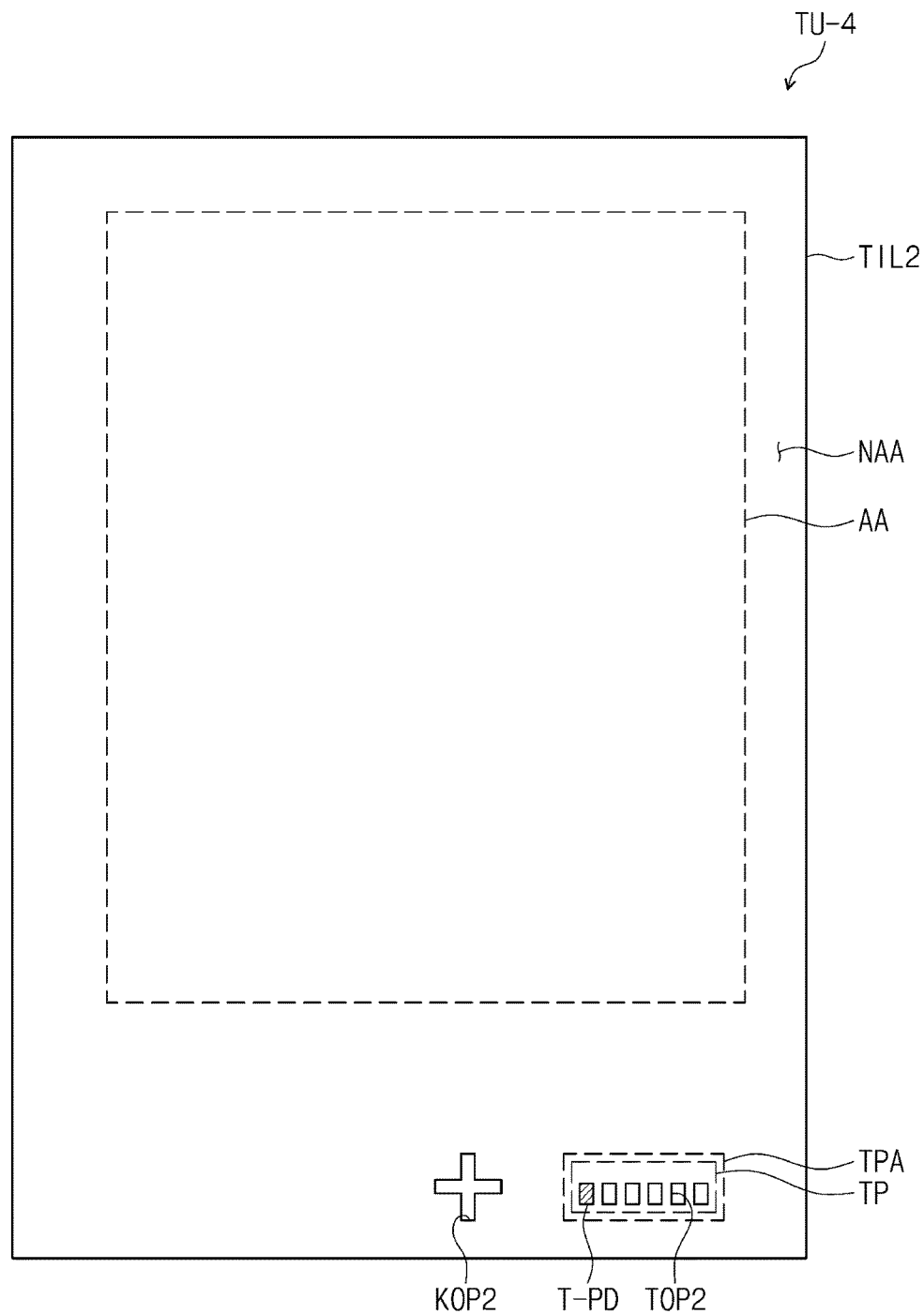
Figure 6:
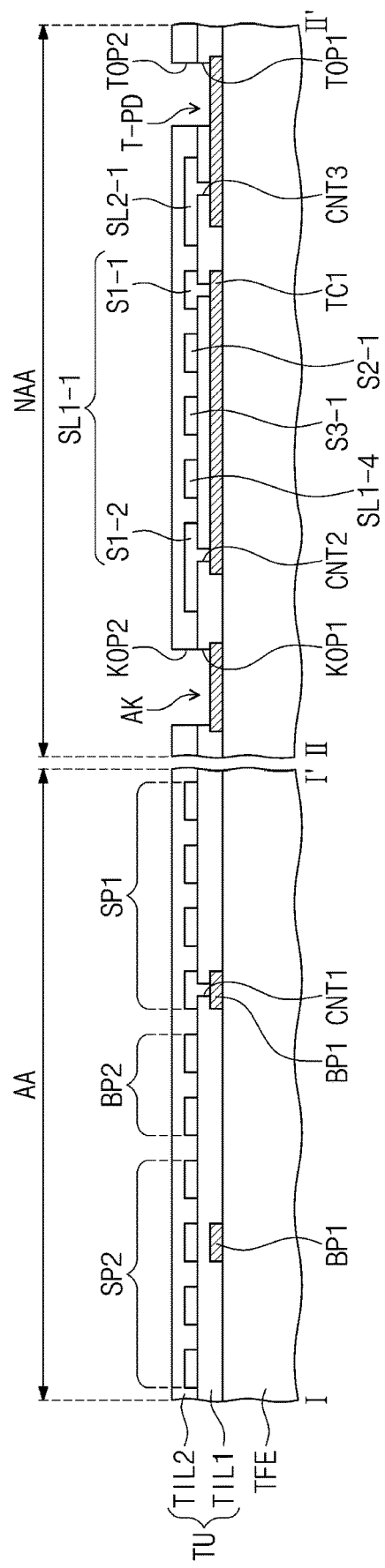
FIG. 6 is cross-sectional view taken along line I-I' and II-I' shown in FIG. 4.

Referring to FIG. 4 to FIG. 5D, the input sensing unit TU according to an embodiment may include first sensing electrodes TE1-1, TE1-2, TE1-3, and TE1-4, second sensing electrodes TE2-1, TE2-2, TE2-3, TE2-4, and TE2-5, sensing lines SL1-1, SL1-2, SL1-3, SL1-4, SL2-1, and SL2-2, bridge patterns TC1, TC2, and TC3, sensing insulation layers TIL1 and TIL2, a pad unit TP, and an align key AK.

The input sensing unit TU senses the change in mutual capacitance between the first sensing electrodes TE1-1, TE1-2, TE1-3, and TE1-4 and the second sensing electrodes TE2-1, TE2-2, TE2-3, TE2-4, and TE2-5 to sense the external input TC (see FIG. 1A), or senses the change in magnetic capacitance of each of the first sensing electrodes TE1-1, TE1-2, TE1-3, and TE1-4 and the second sensing electrodes TE2-1, TE2-2, TE2-3, TE2-4, and TE2-5 to sense the external input TC. The input sensing unit TU according to an embodiment of the present disclosure may sense the external input TC in various suitable manners, but is not limited to any one embodiment.

The first sensing electrodes TE1-1, TE1-2, TE1-3, and TE1-4 are in the active region AA. Each of the first sensing electrodes TE1-1, TE1-2, TE1-3, and TE1-4 may be extended along the second direction D2. The first sensing electrodes TE1-1, TE1-2, TE1-3, and TE1-4 may be arranged along the first direction D1.

Each of the first sensing electrodes TE1-1, TE1-2, TE1-3, and TE1-4 may include a first sensing pattern SP1 and a first connection pattern BP1. The first sensing pattern SP1 is provided in a plurality and may be extended along the second direction D2. The first connection pattern BP1 is provided in a plurality and may be between the first sensing patterns spaced apart from each other. Accordingly, the first connection pattern BP1 may connect (e.g., couple) the first sensing patterns spaced apart from each other.

The second sensing electrodes TE2-1, TE1-2, TE1-3, TE1-4, and TE2-5 are in the active region AA. Each of the second sensing electrodes TE2-1, TE2-2, TE2-3, TE2-4 and TE2-5 may be extended along the first direction D1. The second sensing electrodes TE2-1, TE2-2, TE2-3, TE2-4 and TE2-5 may be arranged along the second direction D2.

Each of the second sensing electrodes TE2-1, TE1-2, TE1-3, TE1-4, and TE2-5 may include a second sensing pattern SP2 and a second connection pattern BP2. The second sensing pattern SP2 is provided in a plurality and may be extended along the first direction D1. The second connection pattern BP2 is provided in a plurality and may be between the second sensing patterns spaced apart from each other. Accordingly, the second connection pattern BP2 may connect (e.g., couple) the second sensing patterns spaced apart from each other.

The sensing lines SL1-1, SL1-2, SL1-3, SL1-4, SL2-1, and SL2-2 are in the non-active region NAA and connected to (e.g., coupled to) corresponding sensing electrodes. For example, first sensing lines SL1-1, SL1-2, SL1-3, and SL1-4 may be connected to (e.g., coupled to) the first sensing electrodes TE1-1, TE1-2, TE1-3, and TE1-4, and second sensing lines SL2-1 and SL2-2 may be connected to (e.g., coupled to) the second sensing electrodes TE2-1, TE1-2, TE1-3, TE1-4, and TE2-5. For convenience of description, the second sensing lines SL2-1 and SL2-2 are partially omitted and illustrated.

According to embodiments of the present disclosure, because the first sensing electrodes TE1-1, TE1-2, TE1-3, and TE1-4 are extended along the second direction D2, e.g., along a long axis of the display unit DU, compared to the second sensing electrodes TE2-1, TE2-2, TE2-3, TE2-4, and TE2-5, the first sensing lines SL1-1, SL1-2, SL1-3, and SL1-4 are connected to (e.g., coupled to) both ends of corresponding first sensing electrodes TE1-1, TE1-2, TE1-3, and TE1-4 to receive an electrically uniform (e.g., substantially electrically uniform) signal. Each of the first sensing electrodes TE1-1, TE1-2, TE1-3, and TE1-4 may include one end relatively adjacent to the pad unit TP and the other end opposing the one end in a direction away from the pad unit TP in the second direction D2.

At least any one selected from among the first sensing lines SL1-1, SL1-2, SL1-3, and SL1-4 may include lines branched on the same layer. For example, each of first sensing lines SL1-1, SL1-2, and SL1-3 selected from among the first sensing lines SL1-1, SL1-2, SL1-3, and SL1-4 except for a first sensing line SL1-4 at the outermost periphery may include first lines S1-1, S2-1, and S3-1 and second lines S1-2, S2-2, and S3-2.

The first lines S1-1, S2-1, and S3-1 and the second lines S1-2, S2-2, and S3-2 may be branched from the non-active region NAA spaced apart from the pad unit TP included in the non-active region NAA. The branching of the first sensing lines SL1-1, SL1-2, and SL1-3 may be provided to prevent or reduce the occurrence of defects due to the electrical connection with the first sensing line SL1-4 on the same layer. The first lines S1-1, S2-1, and S3-1 and the second lines S1-2, S2-2, and S3-2 are spaced apart from each other with the first sensing line SL1-4 interposed therebetween.

The first lines S1-1, S2-1, and S3-1 and the second lines S1-2, S2-2, and S3-2 may be connected by (e.g., coupled by) corresponding bridge patterns TC1, TC2, and TC3. The bridge patterns TC1, TC2, and TC3 may be on a different layer from the first lines S1-1, S2-1, and S3-1 and the second lines S1-2, S2-2, and S3-2 and connected through (e.g., coupled through) a contact hole. A portion of the first sensing line SL1-4 is spaced apart from the first lines S1-1, S2-1, and S3-1 and the second lines S1-2, S2-2, and S3-2 on the same layer, and may overlap a portion of the bridge patterns TC1, TC2, and TC3 on a different layer.

The first lines S1-1, S2-1, and S3-1 may be connected to (e.g., coupled to) one end of corresponding first sensing electrodes TE1-1, TE1-2, and TE1-3. The second lines S1-2, S2-2, and S3-2 may be connected to (e.g., coupled to) the other end of corresponding first sensing electrodes TE1-1, TE1-2, and TE1-3. According to embodiments of the present disclosure, the first sensing line SL1-4 which is not interfered with by other sensing lines is not branched, and may be connected to (e.g., coupled to) one end and the other end of a first sensing electrode TE1-1.

Accordingly, even when the first sensing electrodes TE1-1, TE1-2, TE1-3, and TE1-4 are longer than the second sensing electrodes TE2-1, TE2-2, TE2-3, TE2-4, and TE2-5, an electrical signal can be uniformly (e.g., substantially uniformly) applied to the entire (e.g., substantially the entire) region. Accordingly, regardless of the shape thereof, the input sensing unit TU may provide an even external input sensing environment for the entire (e.g., substantially the entire) active region AA.

In addition, in order to be connected to (e.g., coupled to) one ends and the other ends of the first sensing electrodes TE1-1, TE1-2, TE1-3, and TE1-4 which are relatively long, the first sensing lines SL1-1, SL1-2, SL1-3, and SL1-4 are not branched by a sensing pads T-PD from the pad unit TP but branched on the non-active region NAA, and thus, may reduce a pad region TPA.

However, this is only exemplary, and the present disclosure is not limited thereto. The second sensing electrodes TE2-1, TE2-2, TE2-3, TE2-4, and TE2-5 may also be connected to (e.g., coupled to) two lines. The input sensing unit TU according to an embodiment of the present disclosure may be driven in various suitable manners, but is not limited to any one embodiment.

The pad unit TP includes a plurality of sensing pads T-PD. The pad unit TP is in the non-active region NAA. The sensing pads T-PD may be connected to (e.g., coupled to) sensing lines to transmit data on the external input TC (see FIG. 1A) applied from corresponding sensing electrodes to the second flexible circuit board TF. The sensing pads T-PD may be exposed through (e.g., exposed from) the sensing insulation layers TIL1 and TIL2 included in the input sensing unit TU.

The align key AK is in the non-active region NAA. The align key AK may be in a region adjacent to the pad unit TP in the non-active region NAA. The align key AK may be exposed through (e.g., exposed from) the sensing insulation layers TIL1 and TIL2 included in the input sensing unit TU.

In a process of connecting (e.g., coupling) the second flexible circuit board TF to the pad region TPA, the align key AK may easily identify the degree of alignment of the sensing pads T-PD of input sensing unit TU and pads included in the second flexible circuit board TF. Accordingly, the misalignment between the pads of the second flexible circuit board TF connected to (e.g., coupled to) the sensing pads T-PD is prevented or reduced, so that the display module DM with improved reliability may be provided.

In FIG. 4, one align key AK is illustrated in the shape of a cross (+), but embodiments of the present disclosure are not limited thereto. The shape and the number of the align key AK are not limited thereto as long as the align key AK is adjacent to the pad unit TP and exposed through (e.g., exposed from) the sensing insulation layers TIL1 and TIL2.

FIG. 5A to FIG. 5B are plan views showing the configuration of the input sensing unit TU separated by layers based on conductive layers and the sensing insulation layers TIL1 and TIL2.

Referring to FIG. 5A and FIG. 6, a first layer TU-1 of an input sensing unit according to an embodiment includes a first conductive layer. The first conductive layer may be a layer most adjacent to the display unit DU. For example, the first conductive layer may be a layer including (or composed of) conductive patterns directly on the encapsulation layer TFE (see FIG. 2) of the display unit DU.

The first conductive layer according to an embodiment may include the first connection pattern BP1, the bridge patterns TC1, TC2, and TC3, the sensing pads T-PD, and the align key AK.

The first connection pattern BP1, the bridge patterns TC1, TC2, and TC3, the sensing pads T-PD, and the align key AK included in the first conductive layer may be formed by applying a conductive material on the display unit DU followed by patterning. Accordingly, the first connection pattern BP1, the bridge patterns TC1, TC2, and TC3, the sensing pads T-PD, and the align key AK may have the same (e.g., substantially the same) material and the same (e.g., substantially the same) thickness.

The first connection pattern BP1, the bridge patterns TC1, TC2, and TC3, the sensing pads T-PD, and the align key AK may include a transparent conductive material (e.g., a transparent conductive oxide). For example, the first connection pattern BP1, the bridge patterns TC1, TC2, and TC3, the sensing pads T-PD, and the align key AK may include indium tin oxide (ITO), indium zinc oxide (IZO), zinc oxide (ZnO), and/or indium tin zinc oxide (ITZO). In some embodiments, the first connection pattern BP1, the bridge patterns TC1, TC2, and TC3, the sensing pads T-PD, and the align key AK may include PEDOT (e.g., poly(3,4-ethylene-dioxythiophene) polystyrene sulfonate, which may also be referred to as PEDOT:PSS), a metal nanowire, and/or graphene.

The first connection pattern BP1, the bridge patterns TC1, TC2, and TC3, the sensing pads T-PD, and the align key AK included in the first conductive layer may have a set or predetermined thickness in the third direction D3. For example, the first connection pattern BP1, the bridge patterns TC1, TC2, and TC3, the sensing pads T-PD, and the align key AK may have a thickness of about 400 Å.

Referring to FIG. 5B and FIG. 6, a second layer TU-2 of an input sensing unit according to an embodiment includes a first sensing insulation layer TIL1.

The first sensing insulation layer TIL1 may have a plurality of contact holes CNT1, CNT2, and CNT3 and a plurality of openings KOP1 and TOP1 defined thereon. The plurality of contact holes CNT1, CNT2, and CNT3 and the plurality of openings KOP1 and TOP1 may be formed by penetrating into (or through) the first sensing insulation layer TIL1 in the third direction D3.

First contact holes CNT1 are in the active region AA. For example, the first contact holes CNT1 may overlap corresponding first connection patterns. Accordingly, a portion of each of the plurality of the first connection patterns may be exposed through (e.g., exposed from) the first sensing insulation layer TIL1 by the first contact holes CNT1. In FIG. 5B, as an example, one first connection pattern BP1 included in a first conductive layer is illustrated with a dotted line.

Second contact holes CNT2 are in the non-active region NAA. For example, the second contact holes CNT2 may overlap corresponding bridge patterns TC1, TC2, and TC3. Accordingly, a portion of each of the bridge patterns TC1, TC2, and TC3 may be exposed through (e.g., exposed from) the first sensing insulation layer TIL1 by the second contact holes CNT2. In FIG. 5B, as an example, one bridge pattern TC3 included in a first conductive layer is illustrated with a dotted line.

Third contact holes CNT3 are in the non-active region NAA. For example, the third contact holes CNT3 may overlap corresponding sensing pads T-PD. Accordingly, a portion of each of the bridge patterns TC1, TC2, and TC3 may be exposed through (e.g., exposed from) the first sensing insulation layer TIL1 by the third contact holes CNT3. In FIG. 5B, as an example, one sensing pattern T-PD included in a first conductive layer is illustrated with a dotted line.

A first key opening KOP1 is in the non-active region NAA. For example, the first key opening KOP1 may overlap the align key AK. Accordingly, a portion of the align key AK may be exposed through (e.g., exposed from) the first sensing insulation layer TIL1 by the first key opening KOP1.

A first pad opening TOP1 is in the non-active region NAA. For example, the first pad opening TOP1 may be provided in a plurality and overlap corresponding sensing pads T-PD. Accordingly, a portion of the sensing pads T-PD may be exposed through (e.g., exposed from) the first sensing insulation layer TIL1 by the first pad opening TOP1.

The first sensing insulation layer TIL1 according to an embodiment may include an inorganic material. For example, the first sensing insulation layer TIL1 may include at least one selected from among silicon nitride, silicon oxynitride, and silicon oxide.

The thickness of the first sensing insulation layer TIL1 may be in a range from about 2000 Å to about 2700 Å. When the thickness of the first sensing insulation layer TIL1 is less than about 2000 Å, the insulation function thereof may not be performed for the first conductive layer and a second conductive layer. When the thickness of the first sensing insulation layer TIL1 is greater than about 2700 Å, the transmittance of the first conductive layer including a transparent conductive material may be deteriorated or reduced.

Referring to FIG. 5C and FIG. 6, a third layer TU-3 of an input sensing unit according to an embodiment includes the second conductive layer. The second conductive layer is on the first sensing insulation layer TIL1.

The second conductive layer according to an embodiment may include the first sensing pattern SP1, the second sensing pattern SP2, the second connection pattern BP2, and the sensing lines SL1-1, SL1-2, SL1-3, SL1-4, SL2-1, and SL2-2.

The first sensing pattern SP1, the second sensing pattern SP2, the second connection pattern BP2, and the sensing lines SL1-1, SL1-2, SL1-3, SL1-4, SL2-1, and SL2-2 included in the second conductive layer may be formed by applying a conductive material on the first sensing insulation layer TIL1 followed by patterning. Accordingly, the first sensing pattern SP1, the second sensing pattern SP2, the second connection pattern BP2, and the sensing lines SL1-1, SL1-2, SL1-3, SL1-4, SL2-1, and SL2-2 may include the same (e.g., substantially the same) material.

The first sensing pattern SP1, the second sensing pattern SP2, the second connection pattern BP2, and the sensing lines SL1-1, SL1-2, SL1-3, SL1-4, SL2-1, and SL2-2 may include a metal. For example, the first sensing pattern SP1, the second sensing pattern SP2, the second connection pattern BP2, and the sensing lines SL1-1, SL1-2, SL1-3, SL1-4, SL2-1, and SL2-2 may include molybdenum, silver, titanium, copper, aluminum, and/or an alloy thereof. In some embodiments, the first sensing pattern SP1, the second sensing pattern SP2, the second connection pattern BP2, and the sensing lines SL1-1, SL1-2, SL1-3, SL1-4, SL2-1, and SL2-2 may include PEDOT, a metal nanowire, and/or graphene.

The first sensing patterns spaced apart from each other may be connected to a corresponding first connection pattern BP1 by the first contact holes CNT1 of the first sensing insulation layer TIL1. The first sensing lines SL1-1, SL1-2, and SL1-3 branched from each other may be connected to (e.g., coupled to) corresponding bridge patterns TC1, TC2, and TC3 by the second contact holes CNT2. The sensing lines SL1-1, SL1-2, SL1-3, SL1-4, SL2-1, and SL2-2 may be connected to (e.g., coupled to) corresponding sensing pads T-PD by third contact holes CNT3.

Referring to FIG. 5D and FIG. 6, a fourth layer TU-4 of an input sensing unit according to an embodiment may include a second sensing insulation layer TIL2.

The second sensing insulation layer TIL2 may have a plurality of openings KOP2 and TOP2 defined thereon. The plurality of openings KOP2 and TOP2 may be formed by penetrating into (or through) the second sensing insulation layer TIL2 in the third direction D3.

A second key opening KOP2 is in the non-active region NAA. For example, the second key opening KOP2 may overlap the align key AK. Accordingly, the second key opening KOP2 is aligned with the first key opening KOP1, and at least a portion of the align key AK may be exposed to the outside by the first key opening KOP1 and the second key opening KOP2. According to embodiments of the present disclosure, by including the align key AK containing a transparent conductive material in the first conductive layer at the lowermost portion of the input sensing unit TU, a separate additional process for forming the alignment key AK may be omitted.

In addition, because the align key AK is exposed to the outside from the sensing insulation layers TIL1 and TIL2 by the key openings KOP1 and KOP2 and includes a transparent conductive material having high reflectivity, the align key AK may be more easily identified. Accordingly, in the process of connecting (e.g., coupling) the second flexible circuit board TF to the input sensing unit TU, the misalignment may be suitably or effectively prevented or reduced.

A second pad opening TOP2 is in the non-active region NAA. For example, the second pad opening TOP2 may be provided in a plurality and overlap corresponding sensing pads T-PD. Accordingly, the second pad opening TOP2 is aligned with the first pad opening TOP1, and at least a portion of the sensing pads T-PD may be exposed to the outside by the first pad opening TOP1 and the second pad opening TOP2.

The second sensing insulation layer TIL2 according to an embodiment may include an inorganic material. For example, the second sensing insulation layer TIL2 may include at least one selected from among silicon nitride, silicon oxynitride, and silicon oxide.

The thickness of the second sensing insulation layer TIL2 may be in a range from about 2000 Å to about 2700 Å. When the thickness of the second sensing insulation layer TIL2 is less than about 2000 Å, moisture and impurities introduced into the second conductive layer may not be suitably or effectively blocked. When the thickness of the second sensing insulation layer TIL2 is greater than about 2700 Å, the transmittance of the input sensing unit TU of the present disclosure in which the second conductive layer containing a metal is on the first conductive layer containing a transparent conductive material may be deteriorated or reduced.

According to embodiments of the present disclosure, by limiting the thickness of the first conductive layer and the thickness of sensing insulation layers TIL1 and TIL2, the aperture ratio of the input sensing unit TU having a structure in which the first conductive layer containing a transparent conductive material is on a lower portion thereof and the second conductive layer containing a metal is on the first conductive layer may be improved.

The shape of the alignment key AK may be defined according to the shapes of the aligned key openings KOP1 and KOP2. An align region AKA may be a region in which a portion of the first conductive layer that may be provided as the align key AK is located. Accordingly, the align key AK patterned on the first conductive layer may have an area greater than the area of the key openings KOP1 and KOP2.

Figure 7A:
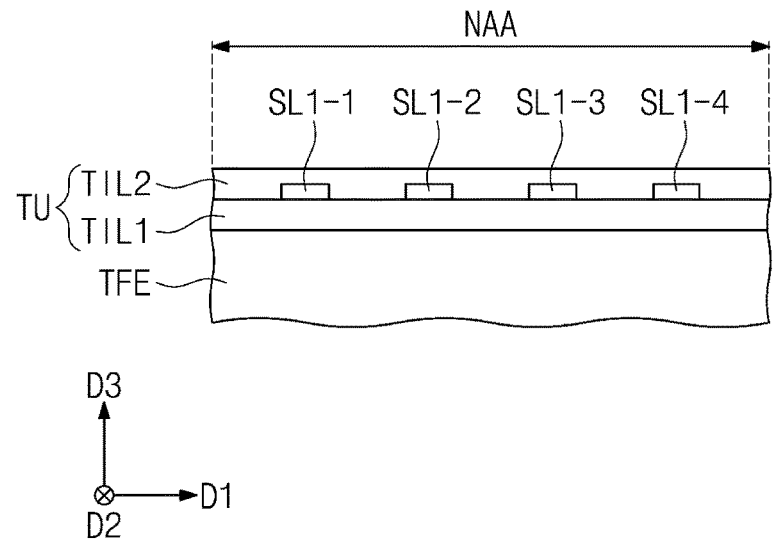
FIG. 7A and FIG. 7B are cross-sectional views taken along line III-III' shown in FIG. 4.
Figure 7B:
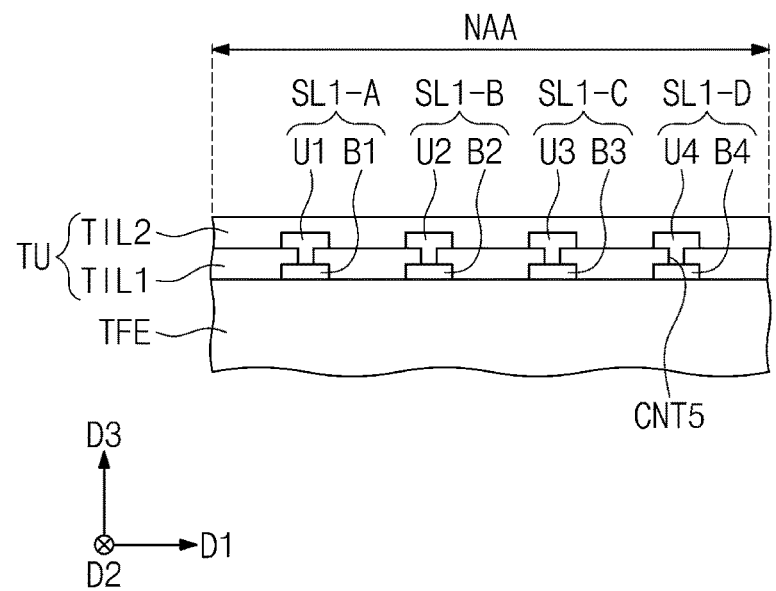

FIG. 7A and FIG. 7B are cross-sectional views taken along line III-III' shown in FIG. 4. The same/similar reference numerals are used for the same/similar components as those described with reference to FIG. 1 to FIG. 6, and redundant descriptions thereof are not repeated here. In FIG. 7A and FIG. 7B, for convenience of description, only some of the sensing lines selected from among the sensing lines SL1-1, SL1-2, SL1-3, SL1-4, SL2-1, and SL2-2 illustrated in FIG. 4 are shown.

Referring to FIG. 7A, the sensing lines SL1-1, SL1-2, SL1-3, and SL1-4 according to an embodiment may have a single-layered structure. For example, the sensing lines SL1-1, SL1-2, SL1-3, and SL1-4 may be lines of a single layer on the second sensing insulation layer TIL2.

In some embodiments, referring to FIG. 7B, sensing lines SL1-A, SL1-B, SL1-C, and SL1-D according to an embodiment may have a multi-layered structure. For example, each of the sensing lines SL1-A, SL1-B, SL1-C, and SL1-D may include first sub-lines B1, B2, B3, and B4 on the first sensing insulation layer TIL1 and second sub-lines U1, U2, U3, and U4 on the second sensing insulation layer TIL2. The first sub-lines B1, B2, B3, and B4 and the second sub-lines U1, U2, U3, and U4 may be connected to (e.g., coupled to) each other by a fifth contact hole CNT5 defined in the second sensing insulation layer TIL2.

According to an embodiment, because the input sensing unit TU includes the sensing lines SL1-A, SL1-B, SL1-C, and SL1-D having a multi-layered structure, defects caused by disconnection may be more suitably or effectively prevented or reduced. Accordingly, the input sensing unit TU with improved reliability may be provided.

According to embodiments of the present disclosure, by limiting the thickness of a first conductive layer and the thickness of sensing insulation layers, the aperture ratio of an input sensing unit having a structure in which a first conductive layer containing a transparent conductive material is on a lower portion thereof and a second conductive layer containing a metal is on the first conductive layer may be improved.

In addition, by locating an align key containing a transparent conductive material on a portion adjacent to a pad unit, misalignment between an input circuit board and a flexible circuit board may be prevented or reduced. Accordingly, an electronic device with improved reliability may be provided.

Although embodiments of the present disclosure have been described with reference to certain embodiments of the present disclosure, it will be understood by those skilled in the art that various changes in form and details may be made therein without departing from the spirit and scope of the present disclosure.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Accordingly, the technical scope of the present disclosure is not intended to be limited to the contents set forth in the detailed description of the specification, but is intended to be defined by the appended claims, and equivalents thereof.

What is claimed is:

1. An electronic device comprising:
an input sensing unit comprising an active region and a non-active region adjacent to the active region, wherein the input sensing unit comprises:
a first sensing insulation layer having a first opening overlapping the non-active region;
a first sensing electrode in the active region, the first sensing electrode comprising a first sensing pattern and a first connection pattern connected to each other;
a second sensing electrode in the active region, the second sensing electrode comprising a second sensing pattern and a second connection pattern, wherein the second sensing pattern is spaced apart from the first sensing pattern, wherein the second connection pattern is connected to the second sensing pattern and is on a layer different from the first connection pattern, and wherein the first sensing insulation layer is between the second sensing pattern and the first connection pattern;
sensing lines in the non-active region and connected to the first sensing electrode and the second sensing electrode, respectively;
a pad unit in the non-active region, the pad unit comprising sensing pads connected to a corresponding sensing line selected from among the sensing lines; and
an align key in the non-active region, wherein the align key is exposed through the first sensing insulation layer by the first opening.

2. The electronic device of claim 1, comprising a second sensing insulation layer on the first sensing insulation layer, the second sensing insulation layer having a second opening aligned with the first opening defined thereon,
wherein the align key is exposed through the second sensing insulation layer by the second opening.

3. The electronic device of claim 2, wherein a thickness of each of the first sensing insulation layer and the second sensing insulation layer is in a range from about 2000 Å to about 2500 Å.

4. The electronic device of claim 1, wherein the align key is on a lower portion of the first sensing insulation layer and the align key comprises a transparent conductive material.

5. The electronic device of claim 4, wherein the first connection pattern and each of the sensing pads of the pad unit are on the same layer as the align key and comprise the same material as that of the align key.

6. The electronic device of claim 5, wherein a thickness of each of the align key, the first connection pattern, and the sensing pads of the pad unit in a third direction is about 400 Å.

7. The electronic device of claim 1, wherein,
the first sensing electrode comprises one end relatively adjacent to the pad unit and an other end facing away from the one end in a direction away from the pad unit, and
at least one of the sensing lines connected to the first sensing electrode selected from among the sensing lines comprises a first line connected to the one end, a second line connected to the other end, and a bridge pattern connected to the first line and the second line.

8. The electronic device of claim 7, wherein,
the bridge pattern is on a lower portion of the first sensing insulation layer, and
each of the first line and the second line is on the first sensing insulation layer and connected to the bridge pattern through contact holes defined in the first sensing insulation layer.

9. The electronic device of claim 8, wherein the first line is connected to a corresponding sensing pad selected from among the sensing pads through a contact hole defined in the first sensing insulation layer.

10. The electronic device of claim 9, wherein the sensing pads are on the same layer as that of the bridge pattern and the align key, and the sensing pads comprise the same transparent conductive material.

11. The electronic device of claim 1, wherein each of the sensing lines comprises a first sub-line and a second sub-line spaced apart from each other with the first sensing insulation layer interposed therebetween, and
wherein the first sub-line and the second sub-line overlap each other and are connected through a contact hole defined in the first sensing insulation layer.

12. The electronic device of claim 1, wherein the input sensing unit comprises connection pads overlapping a corresponding sensing pad selected from among the sensing pads, and the input sensing unit further comprises a sensing circuit board connected to the pad unit.

13. An electronic device comprising:
a display unit comprising pixels configured to display an image; and
an input sensing unit on the display unit, the input sensing unit comprising an active region and a non-active region adjacent to the active region,
wherein the input sensing unit comprises:
a first sensing insulation layer in the active region and the non-active region;
a first sensing electrode in the active region, the first sensing electrode comprising a first sensing pattern on the first sensing insulation layer, and a first connection pattern on a lower portion of the first sensing insulation layer and connected to the first sensing pattern through the first sensing insulation layer;
a second sensing electrode in the active region, the second sensing electrode comprising a second sensing pattern on the first sensing insulation layer and spaced apart from the first sensing pattern, and a second connection pattern connected to the second sensing pattern;
a second sensing insulation layer on the first sensing insulation layer;
sensing lines in the non-active region and connected to the first sensing electrode and the second sensing electrode, respectively;
a pad unit in the non-active region, the pad unit comprising sensing pads connected to a corresponding sensing line selected from among the sensing lines; and
an align key in the non-active region, wherein the align key is exposed through each of the first sensing insulation layer and the second sensing insulation layer.

14. The electronic device of claim 13, wherein the align key is on a lower portion of the first sensing insulation layer and the align key comprises a transparent conductive material.

15. The electronic device of claim 14, wherein the first connection pattern and each of the sensing pads of the pad unit are on the same layer as the align key and comprise the same material as that of the align key.

16. The electronic device of claim 13, wherein each of the first sensing pattern, the second sensing pattern, the second connection pattern, and the sensing lines is on the first sensing insulation layer and comprises a metal.

17. The electronic device of claim 13, wherein, the first sensing electrode comprises one end relatively adjacent to the pad unit and an other end facing away from the one end in a direction away from the pad unit, and at least one of sensing lines connected to the first sensing electrode selected from among the sensing lines comprises a first line connected to the one end, a second line connected to the other end, and a bridge pattern connected to the first line and the second line.

18. An electronic device comprising:

a display unit comprising light emitting patterns configured to display an image; and an input sensing unit on the display unit, the input sensing unit comprising an active region overlapping the light emitting patterns and a non-active region adjacent to the active region, and the input sensing unit comprising an align region and a pad region, wherein the input sensing unit comprises:

a first conductive layer on the display unit, the first conductive layer comprising a plurality of first conductive patterns containing a transparent conductive material;

a second conductive layer on the first conductive layer, the second conductive layer comprising a plurality of second conductive patterns containing a metal;

a first sensing insulation layer between the first conductive layer and the second conductive layer, the first sensing insulation layer having a first opening thereon; and a sensing circuit board connected to the pad region, wherein at least a portion of a first conductive pattern on the align region selected from among the first conductive patterns is exposed through the first sensing insulation layer by the first opening.

19. The electronic device of claim 18, wherein the first conductive pattern exposed by the first opening is provided as an align key.

20. The electronic device of claim 19, comprising a second sensing insulation layer on the first sensing insulation layer, the second sensing insulation layer having a second opening aligned with the first opening defined thereon, wherein the align key is exposed through the second sensing insulation layer by the second opening.

\* \* \* \* \*